(12) United States Patent
Watanabe

(10) Patent No.: US 12,160,247 B2
(45) Date of Patent: Dec. 3, 2024

(54) ANALOG-TO-DIGITAL CONVERTER CIRCUIT

(71) Applicant: DENSO CORPORATION, Kariya (JP)

(72) Inventor: Takamoto Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 206 days.

(21) Appl. No.: 18/057,470

(22) Filed: Nov. 21, 2022

(65) Prior Publication Data

US 2023/0163775 A1    May 25, 2023

(30) Foreign Application Priority Data

Nov. 22, 2021  (JP) ................. 2021-189362

(51) Int. Cl.
  *H03M 1/12*    (2006.01)
(52) U.S. Cl.
  CPC ................. *H03M 1/1245* (2013.01)
(58) Field of Classification Search
  CPC ...... H03M 1/1245; H03M 1/60; H03M 1/502; H03M 1/20
  USPC ........................ 341/155, 157, 160
  See application file for complete search history.

(56) References Cited

U.S. PATENT DOCUMENTS

| | | | |
|---|---|---|---|
| 2012/0013493 A1* | 1/2012 | Kato | .............. H03M 1/0619 327/276 |
| 2019/0334542 A1 | 10/2019 | Watanabe | |

\* cited by examiner

*Primary Examiner* — Peguy Jean Pierre
(74) *Attorney, Agent, or Firm* — Posz Law Group, PLC

(57) ABSTRACT

In an A/D converter circuit, time required for a first pulse signal to have passed through all first delay units of a first pulse delay circuit is defined as first turnaround time, and time required for a second pulse signal to have passed through all second delay units of a second pulse delay circuit is defined as second turnaround time. Average time required for the first pulse signal to pass through any of the first delay units is defined as first passage time, and average time required for the second pulse signal to pass through any of the second delay units is defined as second passage time. A difference between the first and second passage times enables a difference between the first and second turnaround times to be smaller as compared with a reference difference therebetween for a case where the first and second passage times are identical to each other.

14 Claims, 11 Drawing Sheets

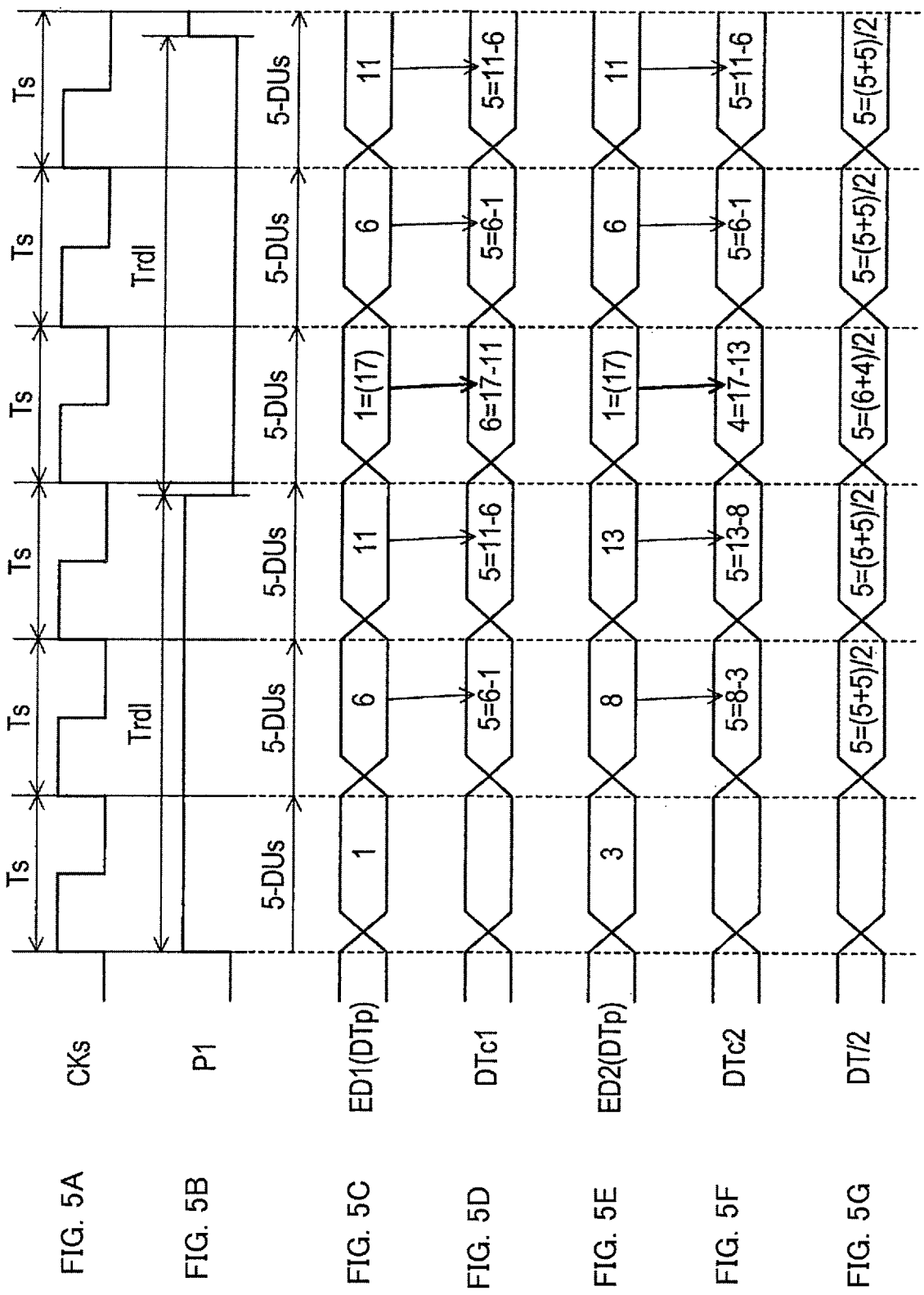

ANALOG-TO-DIGITAL CONVERTER CIRCUIT

CROSS-REFERENCE TO RELATED APPLICATION

This application is based on and claims the benefit of priority from earlier Japanese Patent Application No. 2021-189362 filed on Nov. 22, 2021, the entire disclosure of which is incorporated herein by reference.

TECHNICAL FIELD

The present disclosure relates to analog-to-digital (A/D) converter circuits for digitizing predetermined analog information.

BACKGROUND

As an example of an A/D converter, a digitizing apparatus is known, which is comprised of a pair of first and second pulse delay circuits. Each of the first and second pulse delay circuits is comprised of a plurality of delay units that are connected in a ring-like cascade structure to each other.

SUMMARY

In an A/D converter circuit according to an aspect of the present disclosure, time required for a first pulse signal to have passed through all first delay units of a first pulse delay circuit is defined as first turnaround time, and time required for a second pulse signal to have passed through all second delay units of a second pulse delay circuit is defined as second turnaround time. Average time required for the first pulse signal to pass through any of the first delay units is defined as first passage time, and average time required for the second pulse signal to pass through any of the second delay units is defined as second passage time. A difference between the first and second passage times enables a difference between the first and second turnaround times to be smaller as compared with a reference difference therebetween for a case where the first and second passage times are identical to each other.

BRIEF DESCRIPTION OF THE DRAWINGS

Other aspects of the present disclosure will become apparent from the following description of embodiments with reference to the accompanying drawings in which:

FIGS. 5A to 5G are a joint timing chart schematically illustrating how the A/D converter operates;

DETAILED DESCRIPTION OF EMBODIMENTS

Figure 1:
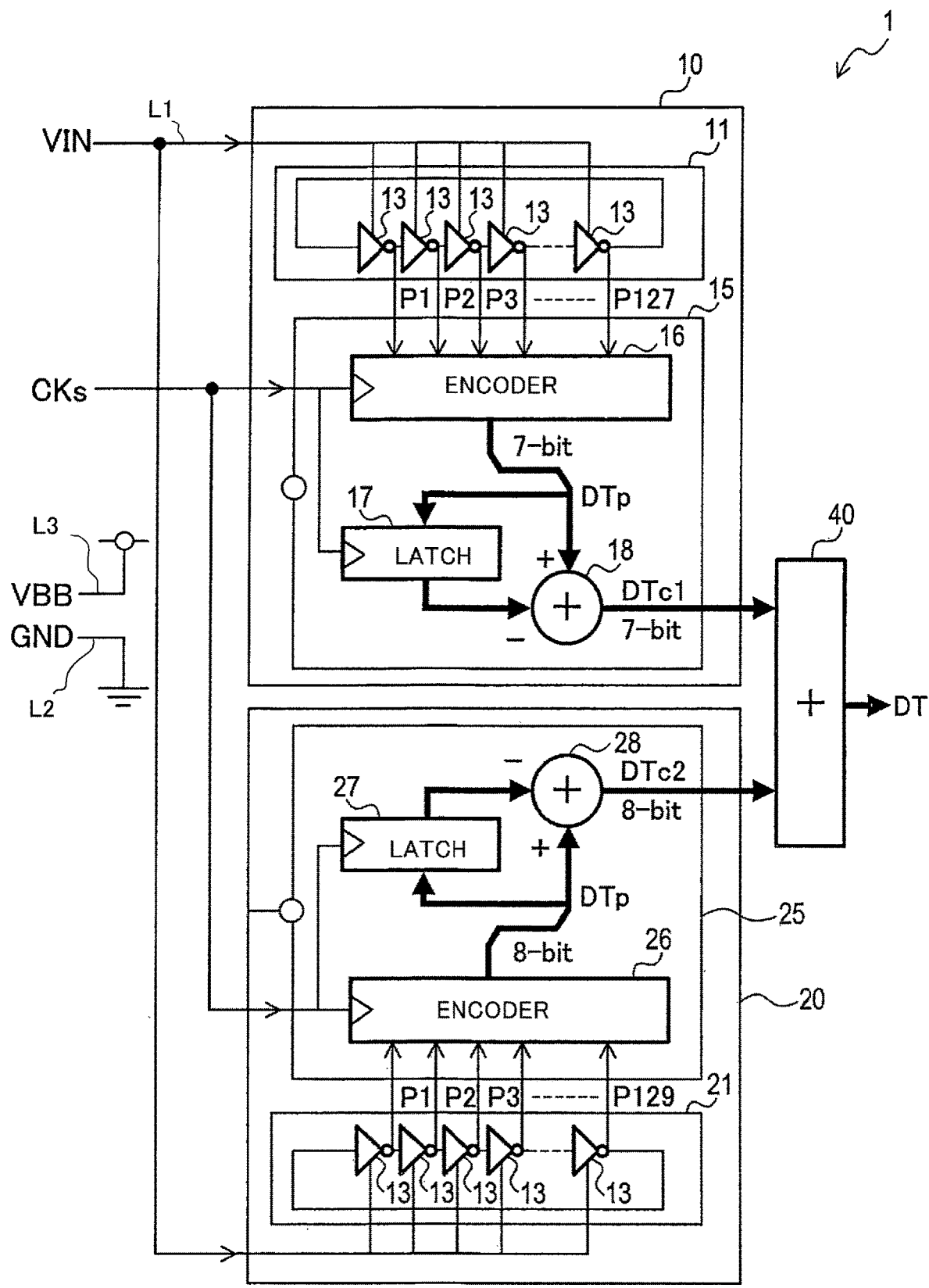
FIG. 1 is a circuit block diagram illustrating a schematic configuration of an A/D converter according to an exemplary embodiment of the present disclosure.

Japanese Patent Application Publication No. 2018-182561 discloses a digitizing apparatus, which is an example of an A/D converter, comprised of a pair of first and second pulse delay circuits. The first pulse delay circuit is comprised of a plurality of delay units that are connected in a ring-like cascade structure to each other. Similarly, the second pulse delay circuit is comprised of a plurality of delay units that are connected in a ring-like cascade structure to each other. The number of delay units included in the first pulse delay circuit is set to be different from the number of delay units included in the second pulse delay circuit.

Each of the delay units includes various gate circuits.

The plurality of delay units included in each of the first and second pulse delay circuits correspond to a plurality of stages of delay.

Each delay unit included in each of the first and second pulse delay circuits is connected between a positive power line and a negative power line, and an analog input voltage, which is a digitizing target, is configured to be supplied across each delay unit via the positive and negative power lines.

The digitizing apparatus disclosed in the patent publication is configured such that a pulse signal inputted to one of the delay units of each of the first and second pulse delay circuits is sequentially transferred through the delay units of the corresponding one of the first and second delay circuits while being delayed thereby. When the pulse signal is transferred through each delay unit, a transfer speed of the pulse signal through the corresponding delay unit is determined based on a delay time of the pulse signal through the corresponding delay unit; the delay time of the pulse signal through each delay unit depends on the power supply voltage for the corresponding delay unit.

Counting (i) the number of stages, i.e., delay units, in the plurality of delay units of the first pulse delay circuit through which the pulse signal has passed during a predetermined sample period and (ii) the number of stages, i.e., delay units, in the plurality of delay units of the second pulse delay circuit through which the pulse signal has passed during the predetermined sample period enables the analog input voltage to be converted into digital numeric data. Making larger the sample period and faster the delay time of each delay unit enables the A/D converter circuit to have a higher resolution and a higher conversion speed.

As described above, the number of delay units included in the first pulse delay circuit is set to be different from the number of delay units included in the second pulse delay circuit. If there is a condition, which is called "overflow", where the pulse signal returns from the last delay unit to the initial delay unit in, for example, the first pulse delay circuit, the overflow of the first pulse delay circuit may result in an anomalous code error in an output value of the first pulse delay circuit. Like the first pulse delay circuit, the overflow of the second pulse delay circuit may result in an anomalous code error in an output value of the second pulse delay circuit.

For addressing the occurrence of such an anomalous code, the digitizing apparatus according to the patent publication, which will be referred to as a conventional digitizing apparatus, is configured to mutually complement (i) the anomalous code error in the output value of the first pulse delay circuit and (ii) the anomalous code error in the output value of the second pulse delay circuit with one another, making it possible to reduce an error of the digital numeric data as an A/D conversion result of the conventional digitizing apparatus.

As described above, because the number of delay units included in the first pulse delay circuit different from the number of delay units included in the second pulse delay circuit, the frequency of the occurrence of the overflow in the first pulse delay circuit may be different from that in the second pulse delay circuit. This overflow-frequency difference may result in an increase in the possibility of each of the A/D conversion results of the conventional digitizing apparatus containing an error, resulting in a reduction in the accuracy of the A/D conversion of the conventional digitizing apparatus.

From this viewpoint, the present disclosure aims to provide analog-to-digital converter circuits, each of which is capable of digitizing predetermined analog information with a higher accuracy.

An exemplary measure according to the present disclosure provides an analog-to-digital converter circuit for digitizing predetermined analog information. The analog-to-digital converter circuit includes a first digitizing unit.

The first digitizing unit includes a first pulse delay circuit including a plurality of first delay units connected in series. Each first delay unit is configured such that an analog signal having a voltage is inputted thereto. The first pulse delay circuit is configured to transfer a first pulse signal therethrough while the first pulse signal is delayed by each first delay unit. A delay time of each first delay unit depends on the voltage of the analog signal. The first digitizing unit includes a first output unit configured to output a first digital data value based on the number of first delay units in the first pulse delay circuit through which the pulse signal has passed.

The analog-to-digital converter circuit includes a second digitizing unit.

The second digitizing unit includes a second pulse delay circuit including a plurality of second delay units connected in series. Each second delay unit is configured such that the analog signal is inputted thereto, the second pulse delay circuit being configured to transfer a second pulse signal therethrough while the second pulse signal is delayed by each second delay unit. A delay time of each second delay unit depends on the voltage of the analog signal. The plurality of second delay units is greater than the plurality of first delay units. The second digitizing unit includes a second output unit configured to output a second digital data value based on the number of second delay units in the second pulse delay circuit through which the pulse signal has passed.

The analog-to-digital converter circuit includes a sum output unit configured to calculate the sum of the first digital data value outputted from the first output unit and the second digital data value outputted from the second output unit to accordingly obtain the calculated sum as a final digital data value.

Time required for the first pulse signal to have passed through all the delay units included in the first pulse delay circuit is defined as first turnaround time, and time required for the second pulse signal to have passed through all the delay units included in the second pulse delay circuit is defined as second turnaround time.

Average time required for the first pulse signal to pass through any of the delay units included in the first pulse delay circuit is defined as first passage time, and average time required for the second pulse signal to pass through any of the delay units included in the second pulse delay circuit is defined as second passage time.

The first passage time for the first pulse delay circuit and the second passage time for the second pulse delay circuit are set to be different from one another. A difference between the first passage time and the second passage time enables a difference between the first turnaround time and the second turnaround time to be smaller as compared with a reference difference between the first turnaround time and the second turnaround time for a case where the first passage time and the second passage time are identical to each other.

This configuration of the analog-to-digital converter circuit according to the exemplary measure results in a reduction in the difference between the first turnaround time and the second turnaround time, making it possible to match the frequency of the occurrence of overflow in the first pulse delay circuit with that in the second pulse delay circuit as uniform as possible. This therefore offers the analog-to-digital converter circuit with a higher analog-to-digital conversion accuracy.

The following describes an exemplary embodiment of the present disclosure with reference to the accompanying drawings.

The following describes an A/D converter 1, which is an example of A/D converter circuits, according to the exemplary embodiment with reference to FIGS. 1 to 11.

The A/D converter 1 illustrated in FIG. 1 serves as a circuit that outputs a digital value based on a voltage, i.e., potential, of an input analog signal.

Specifically, the A/D converter 1 includes a first digitizing unit 10, a second digitizing unit 20, and a sum output unit 40.

Each of the first and second digitizing units 10 and 20 is arranged such that a bias voltage VBB, a ground voltage GND, a reference clock CKs, and an analog signal VIN having a voltage (potential) are inputted to the corresponding one of the first and second digitizing units 10 and 20. The reference clock CKs consists of periodic clock pulses having a period Ts (see FIG. 5A).

Each of the first and second digitizing units 10 and 20 serves as a known time-based A/D converter for converting the analog signal VIN into digital numeric data.

The digital numeric data converted by the first digitizing unit 10, which will also be referred to as a binary data value DTc1, corresponds to a digital value of the voltage of the analog signal VIN, and the digital numeric data converted by the second digitizing unit 20, which will also be referred to as a binary data value DTc2, corresponds to a digital value of the voltage of the analog signal VIN.

The binary data value DTc1 and the binary data value DTc2 are inputted to the sum output unit 40.

The sum output unit 40 is configured to calculate the sum of the binary data value DTc1 and the binary data value DTc2, which can be represented by (DTc1+DTc2), to accordingly obtain a digital data value DT; the digital data value DT is the result of analog-to-digital conversion of the analog signal VIN.

The first digitizing unit 10 is comprised of a ring-like pulse delay circuit 11 and a first output unit 15, and the second digitizing unit 20 is comprised of a ring-like pulse delay circuit 21 and a second output unit 25.

Figure 2:
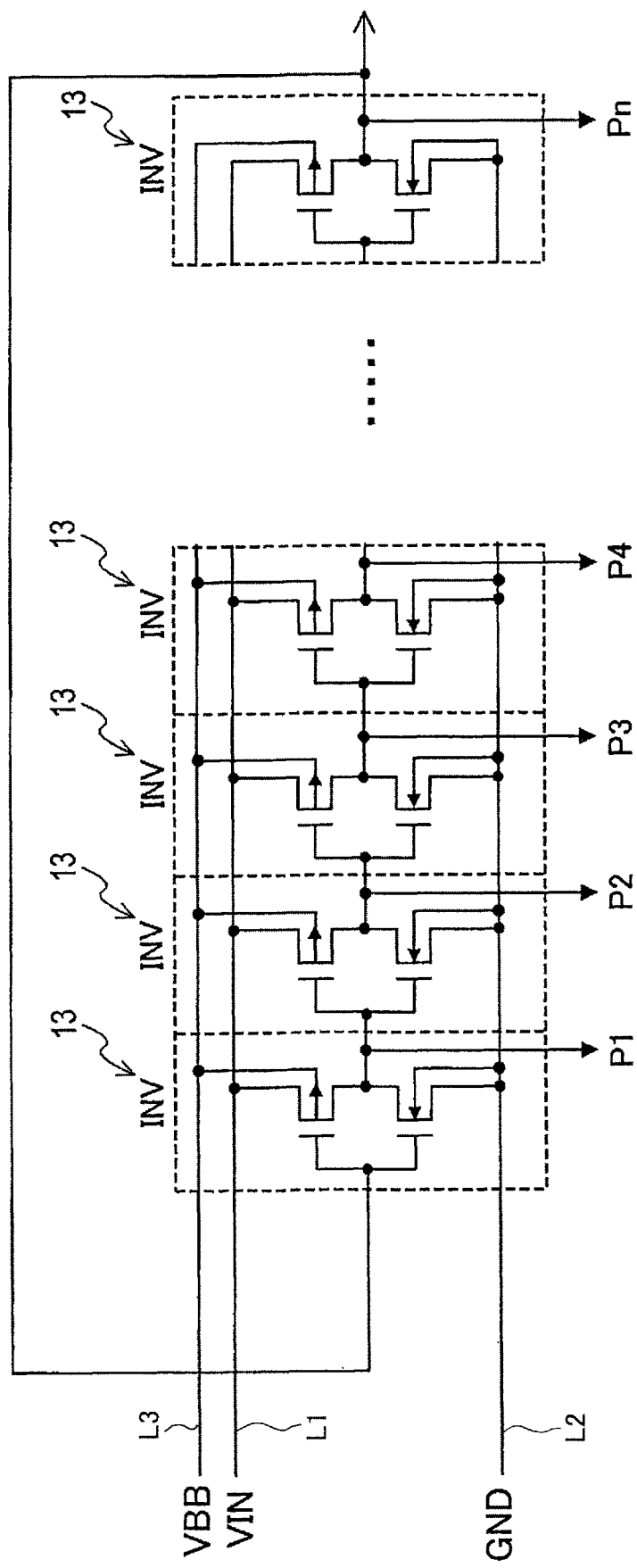
FIG. 2 is a circuit diagram illustrating a schematic configuration of each of first and second pulse delay circuits illustrated in FIG. 1.
Figure 3:
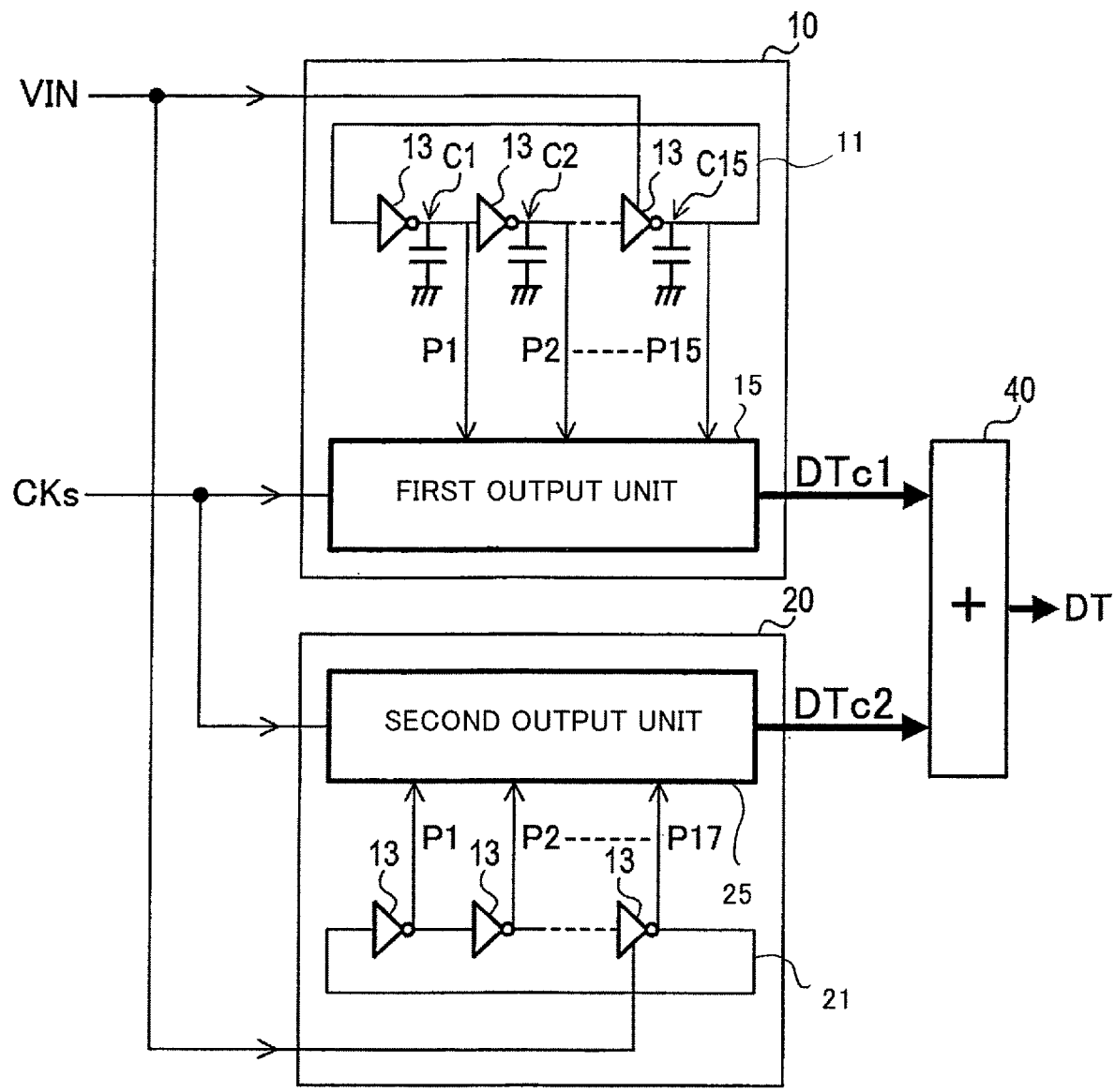
FIG. 3 is a circuit block diagram schematically illustrating the first pulse delay circuit including adjusters according to the exemplary embodiment.

As illustrated in FIGS. 1 and 2, the pulse delay circuit 11 is comprised of X delay units 13 connected in series to one another in a ring form; the number X of delay units 13 serves as the number X of stages of delay. The pulse delay circuit 11 serves as a time-based A/D conversion circuit and will also be referred to as a ring delay line. The number X is set to an odd number, for example, 127, i.e., $(2^{n=7}-1)$.

Similarly, the pulse delay circuit 21 is comprised of Y delay units 13 connected in series to one another in a ring form; the number Y of delay units 13 serves as the number Y of stages of delay. The pulse delay circuit 21 serves as a time-based A/D conversion circuit and will also be referred to as a ring delay line. The number Y is set to an odd number, for example, 129, i.e., $(2^{n=7}+1)$.

The delay units 13 serving as the first to Xth delay units, i.e., the first to Xth stages of delay, in the pulse delay circuit 11 are respectively inverters (INV in FIG. 2), i.e., NOT gates, 13.

That is, the pulse delay circuit 11 is comprised of the X (=127) inverters 13.

Similarly, the delay units 13 serving as the second to Yth delay units, i.e., the first to Yth stages of delay, in the pulse delay circuit 21 are respectively inverters, i.e., NOT gates, 13.

That is, the pulse delay circuit 12 is comprised of the Y (=129) inverters 13.

Each of the delay units 13 of each of the pulse delay circuits 11 and 21 has an input terminal and an output terminal.

The input terminal of each delay unit 13 of each of the pulse delay circuits 11 and 21 is cascade-connected to the output terminal of the immediately previous stage delay unit. The output terminal of the last stage delay unit 13 of each of the pulse delay circuits 11 and 21 is connected to the input terminal of the first delay unit 13.

The output terminals of the respective delay units 13 of the pulse delay circuit 11 are connected to the first output unit 15, so that outputs P1 to P127 of the respective first to 127th delay unit 13 are therefore inputted to the first output unit 15.

The first output unit 15 includes an encoder 16, a latch 17, and an adder 18.

Similarly, the output terminals of the respective delay units 13 of the pulse delay circuit 21 are connected to the second output unit 25, so that outputs P1 to P129 of the respective first to 129-th delay unit 13 are therefore inputted to the second output unit 25.

The second output unit 25 includes an encoder 26, a latch 27, and an adder 28.

Each delay unit 13 has a power supply terminal, a ground terminal, and a bias terminal (see FIG. 2).

As illustrated in FIG. 2, each inverter (NOT gate) 13 is designed as a CMOS inverter comprised of a pair of N- and P-channel MOSFETs whose gates are connected to each other to serve as the input terminal thereof and whose sources are connected to each other to serve as the output terminal thereof.

The A/D converter 1 includes a positive power supply line L1, a negative power supply line L2, and a bias supply line L3.

Referring to FIG. 2, the positive power supply line L1 is connected to the power supply terminal, i.e., the source of the P-channel MOSFET, of each delay unit 13.

The negative power supply line L2 is connected to the ground terminal of each delay unit 13.

The bias supply line L3 is connected to the bias terminal of each delay unit 13.

The analog signal VIN is inputted through the positive power supply line L1 to the power supply terminal of each delay unit 13. The negative power supply line L2 has the ground voltage GND that is set to a reference voltage that is lower than the voltage of the analog signal VIN, such as 0 volts (V), so that the negative power supply line L2 serves as a signal common for the delay units 13.

The voltage of the analog signal VIN is therefore supplied to each of the delay units 13 as a power supply voltage, so that the power supply voltage inputted to each of the delay units 13 activates the corresponding one of the delay units 13.

Each delay unit 13 of each pulse delay circuit 11, 21 is configured such that an operating time of the corresponding delay unit depends on the voltage of the analog signal VIN, resulting in the delay time of each delay unit depending on the voltage of the analog signal VIN.

When a pulse signal, which serves as a first pulse signal, is naturally induced in the pulse delay circuit 11, the first delay unit 13 works to transfer the pulse signal to the next delay unit 13 while delaying the pulse signal by a time of delay; the time of delay of each delay unit 13 depends on the voltage of the analog signal VIN inputted to the corresponding delay unit.

Each of the remaining second to (X−1)th delay unit 13 except for the last delay unit 13 of the pulse delay circuit 11 sequentially transfers the pulse signal transferred from the immediately previous delay unit to the next delay unit while delaying the pulse signal by the predetermined time of delay. The last delay unit 13 of the pulse delay circuit 11 transfers the pulse signal transferred from the immediately previous delay unit to the next first delay unit 13 while delaying the pulse signal by the predetermined time of delay, so that the pulse signal returns from the last delay unit 13 to the first delay unit 13 of the pulse delay circuit 11, i.e., the overflow of the pulse delay circuit 11 occurs.

Similarly, when a pulse signal, which serves as a second pulse signal, is naturally induced in the pulse delay circuit 21, the first delay unit 13 works to transfer the pulse signal to the next delay unit 13 while delaying the pulse signal by a time of delay; the time of delay of each delay unit 13 depends on the voltage of the analog signal VIN inputted to the corresponding delay unit.

Each of the remaining second to (Y−1)th delay units 13 except for the last delay unit 13 sequentially transfers the pulse signal transferred from the immediately previous delay unit to the next delay unit while delaying the pulse signal by the predetermined time of delay, so that the pulse signal returns from the last delay unit 13 to the first delay unit 13 of the pulse delay circuit 21, i.e., the overflow of the pulse delay circuit 21 occurs.

The last delay unit 13 transfers the pulse signal transferred from the immediately previous delay unit to the next first delay unit 13 while delaying the pulse signal by the predetermined time of delay.

As described above, the time of delay of each delay unit 13 depends on the voltage of the analog signal VIN inputted to the corresponding delay unit. For this reason, the rate of transfer of the pulse signal passing through any delay unit 13 depends on the voltage of the analog signal VIN inputted to the delay unit 13.

As described above, the A/D converter 1 according to the exemplary embodiment is configured such that no pulse signals are externally inputted thereto. Specifically, immediately after activation of the A/D converter 1, a pulse signal is naturally induced in each of the first and second pulse delay circuits 11 and 21 due to noise, for example, thermal noise, and the pulse signal naturally induced in each of the first and second pulse delay circuits 11 and 21 is ready to circulate stably when the activated A/D converter 1 is ready to perform A/D conversion. Thereafter, the pulse signal naturally, which is ready to circulate stably in each of the first and second pulse delay circuits 11 and 21 is inputted to the first delay unit 13 of the corresponding one of the first and second pulse delay circuits 11 and 21. In particular, even if plural pulse signals are induced naturally in each of the first and second pulse delay circuits 11 and 21, inventor's experiments have shown that lower level pulse signals except for the highest-level pulse signal in the plural pulse signals are absolved in the highest-level pulse signal or disappear. This therefore enables the remaining pulse signal, i.e., the highest-level pulse signal, in each of the first and second pulse delay circuits 11 and 21 to circulate through the delay units 13 of the corresponding one of the first and second pulse delay circuits 11 and 21.

The passing of the pulse signal through each delay unit 13 represents inversion of the output level of the corresponding delay unit 13 from the low level to the high level or from the high level to the low level in response to level change of the input terminal (the gate of the P- and N-channel MOSFETs) of the corresponding delay unit 13 from the low level to the high level or from the high level to the low level; the level change of the first input terminal of the corresponding delay unit 13 is generated in response to the pulse signal reaching the input terminal of the corresponding delay unit 13.

After the passing of the pulse signal through any delay unit 13, the pulse signal is inputted to the next delay unit 13. That is, in each of the ring-like pulse delay circuits 11 and 21, the sequential passing and inputting of the pulse signal is successively carried out through the delay units 13 in a chain reaction.

The rate of transfer of the pulse signal for each pulse delay circuit 11, 21 can be expressed as the number of delay units in the corresponding pulse delay circuit 11, 21 through which the pulse signal has passed per unit of time. That is, an increase in the rate of transfer of the pulse signal for each pulse delay circuit 11, 21 increases the number of delay units in the corresponding pulse delay circuit 11, 21 through which the pulse signal has passed per unit of time.

For example, FIG. 5B shows an example of how the output P1 of the first delay unit 13 of, for example, the pulse delay circuit 11 changes over time depending on the voltage of the analog signal VIN inputted to the first delay unit 13.

That is, the level of the output P1 of the first delay unit 13 of the pulse delay circuit 11 is inverted each time the pulse signal returns from the last delay unit 13 to the first delay unit 13, i.e., each time the overflow of the pulse delay circuit 11 occurs. That is, a period for which the level of the output P1 of the first delay unit 13 is maintained at the high or low level (see reference character Trd1 in FIG. 5B) shows an overflow period so that the overflow of the pulse delay circuit 11 occurs every overflow period.

FIG. 5B shows that an increase in the voltage of the analog signal VIN results in a decrease in the overflow period Trd1, resulting in an increase in the frequency of the overflow of the pulse delay circuit 11.

This can be similarly established for the pulse delay circuit 21.

As described in detail later, the overflow of each of the pulse delay circuits 11 and 21 can show a situation where an output DTp of the corresponding one of the encoders 16 and 26, which has become its maximum value, returns to zero.

In the exemplary embodiment, the action that the pulse signal has passed through all the delay units 13 included in each of the first and second pulse delay circuits 11 and 21 will also be referred to as an all delay-unit pass of the pulse signal.

As illustrated in FIG. 2, the bias voltage VBB is inputted to the bias terminal of each delay unit 13 through the bias supply line L3. The rate of transfer of the pulse signal passing through any delay unit 13 also depends on the bias voltage VBB inputted to the delay unit 13.

Each of the encoders 16 and 26 is designed as, for example, a latch encoder.

The encoder 16 is configured to
(I) Capture, through NOT gates NG (see FIG. 4), the outputs P1 to P127, each of which has the high level or low level, of the respective first to 127-th delay units 13 of the pulse delay circuit 11 for each cyclic timing defined by the reference clock CKs
(II) Encode, based on the captured outputs P1 to P127, a position of the pulse signal at the corresponding cyclic timing, i.e., one of the delay units 13 through which the pulse signal has just passed at the corresponding cyclic timing, to thereby generate the output DTp representing the position of the pulse signal at the corresponding cyclic timing Similarly, the encoder 26 is configured to
(I) Capture, through NOT gates NG (see FIG. 4), the outputs P1 to P129, each of which has the high level or low level, of the respective first to 129-th delay units 13 of the pulse delay circuit 21 for each cyclic timing defined by the reference clock CKs
(II) Encode, based on the captured outputs P1 to P129, a position of the pulse signal at the corresponding cyclic timing, i.e., one of the delay units 13 through which the pulse signal has just passed at the corresponding cyclic timing, to thereby generate the output DTp representing the position of the pulse signal at the corresponding cyclic timing The output DTp of the encoder 16 is expressed as a binary data value of 7 bits, because the number of the captured outputs P1 to P127 from the pulse delay circuit 11 is 127, i.e., $(2^7-1)$, so that 7-bit digital data is adequate for expressing the captured outputs P1 to P127 from the pulse delay circuit 11.

Similarly, the output DTp of the encoder 26 is expressed as a binary data value of 8 bits, which is higher by 1 bit than the 7-bit output DTp of the encoder 16, because the number of the captured outputs P1 to P129 from the pulse delay circuit 11 is 129, i.e., $(2^7+1)$, so that 8-bit digital data is required for expressing the captured outputs P1 to P129 from the pulse delay circuit 21.

The output DTp of the encoder 16 is inputted to both the latch 17 and the adder 18, and the output DTp of the encoder 26 is similarly inputted to both the latch 27 and the adder 28.

The latch 17 is configured to
(1) Latch the newest output DTp inputted thereto from the encoder 16 at each cyclic timing
(2) Output, as a comparison value, an immediately previous output DTp latched at the immediately previous timing relative to the corresponding cyclic timing to the adder 18

Similarly, the latch 27 is configured to
(1) Latch the newest output DTp inputted thereto from the encoder 26 at each cyclic timing
(2) Output, as a comparison value, an immediately previous output DTp latched at the immediately previous timing relative to the corresponding cyclic timing to the adder 28

The adder 18 is configured to subtract, from the newest output DTp of the encoder 16, the comparison value, i.e., the immediately previous latched output DTp, outputted from the latch 17. Similarly, the adder 28 is configured to subtract, from the newest output DTp of the encoder 26, the comparison value, i.e., the immediately previous latched output DTp, outputted from the latch 27.

For example, let us assume that the outputs P1 to P127 of the pulse delay circuit 11 are captured for every predetermined number of cycles of the reference clock CKs, and the outputs P1 to P129 of the pulse delay circuit 12 are similarly captured for every predetermined number of cycles of the reference clock CKs.

In this assumption, the adder 18 is configured to subtract, from the newest output DTp of the encoder 16 captured at the timing when the predetermined number of cycles of the reference clock CKs has elapsed, the comparison value, i.e., the immediately previous latched output DTp, latched for the predetermined number of cycles of the reference clock CKs. In other words, the adder 18 is configured to subtract, from the newest position of the pulse signal at the timing when the predetermined number of cycles of the reference clock CKs has elapsed, the immediately previous position of the pulse signal before lapse of the predetermined number of cycles of the reference clock CKs.

Similarly, the adder 28 is configured to subtract, from the newest output DTp of the encoder 26 captured at the timing when the predetermined number of cycles of the reference clock CKs has elapsed, the comparison value, i.e., the immediately previous latched output DTp, latched for the predetermined number of cycles of the reference clock CKs. In other words, the adder 28 is configured to subtract, from the newest position of the pulse signal at the timing when the predetermined number of cycles of the reference clock CKs has elapsed, the immediately previous position of the pulse signal before lapse of the predetermined number of cycles of the reference clock CKs.

For example, the adder 18 is configured to convert the 7-bit comparison value, i.e., the 7-bit immediately previous latched output DTp, into a corresponding two's complement, and calculate the sum of the 7-bit newest output DTp of the encoder 16 and the two's complement of the 7-bit comparison value to thereby obtain a binary data value DTc1.

Similarly, the adder 28 is configured to convert the 8-bit comparison value, i.e., the 8-bit immediately previous latched output DTp, into a corresponding two's complement, and calculate the sum of the 8-bit newest output DTp of the encoder 26 and the two's complement of the 8-bit comparison value to thereby obtain a binary data value DTc2.

Hereinafter, for the sake of simple description of the calculation, let us assume that the first pulse delay circuit 11 is comprised of X delay units 13; the number X is set to 15, i.e., $(2^{n=4}-1)$, and the second pulse delay unit 21 is comprised of Y delay units 13; the number Y is set to 17, i.e., $(2^{n=4}+1)$. That is, the first pulse delay circuit 11 is comprised of the first to fifteenth delay units 13, and the second pulse delay circuit 21 is comprised of the first to seventeenth delay units 13.

Time required for all delay-unit pass of the pulse signal in the first pulse delay circuit 11, i.e., time required for the pulse signal to have passed through all the delay units 13 included in the first pulse delay circuit 11, will be referred to as first turnaround time. Similarly, time required for all delay-unit pass of the pulse signal in the second pulse delay circuit 21, i.e., time required for the pulse signal to have passed through all the delay units 13 included in the second pulse delay circuit 21, will be referred to as second turnaround time.

Average time required for the pulse signal to pass through any of the delay units 13 included in the first pulse delay circuit 11, i.e., time calculated by dividing the first turnaround time by the number of delay units 13 included in the first pulse delay circuit 11, will be referred to as first passage time. Similarly, average time required for the pulse signal to pass through any of the delay units 13 included in the second pulse delay circuit 21, i.e., time calculated by dividing the second turnaround time by the number of delay units 13 included in the second pulse delay circuit 21, will be referred to as second passage time.

The A/D converter 1 according to the exemplary embodiment is configured such that the first passage time for the first pulse delay circuit 11 and the second passage time for the second pulse delay circuit 21 are set to be different from one another; the difference between the first passage time and the second passage time enables a difference between the first turnaround time and the second turnaround time to be smaller as compared with a reference difference between the first turnaround time and the second turnaround time for a comparison example where the first passage time and the second passage time are identical to each other.

Specifically, the rate of transfer of the pulse signal for the first pulse delay circuit 11 of the first digitizing unit 10 is set to be slower than the rate of transfer of the pulse signal for the second pulse delay circuit 21 of the second digitizing unit 20, so that the first passage time for the first pulse delay circuit 11 of the first digitizing unit 10 is greater than the second passage time for the second pulse delay circuit 21 of the second digitizing unit 20.

The first pulse delay circuit 11 of the first digitizing unit 10 of the A/D converter 1 according to the exemplary embodiment includes adjusters C1 to C15 uniformly provided for the respective first to fifteenth delay units 13 of the first pulse delay circuit 11. The configurations of the adjusters C1 to C15 are identical to one another. This enables time required for the pulse signal to pass through any of the first to fifteenth delay units 13 to be identical to time required for the pulse signal to pass through another of the first to fifteenth delay units 13.

Figure 4:
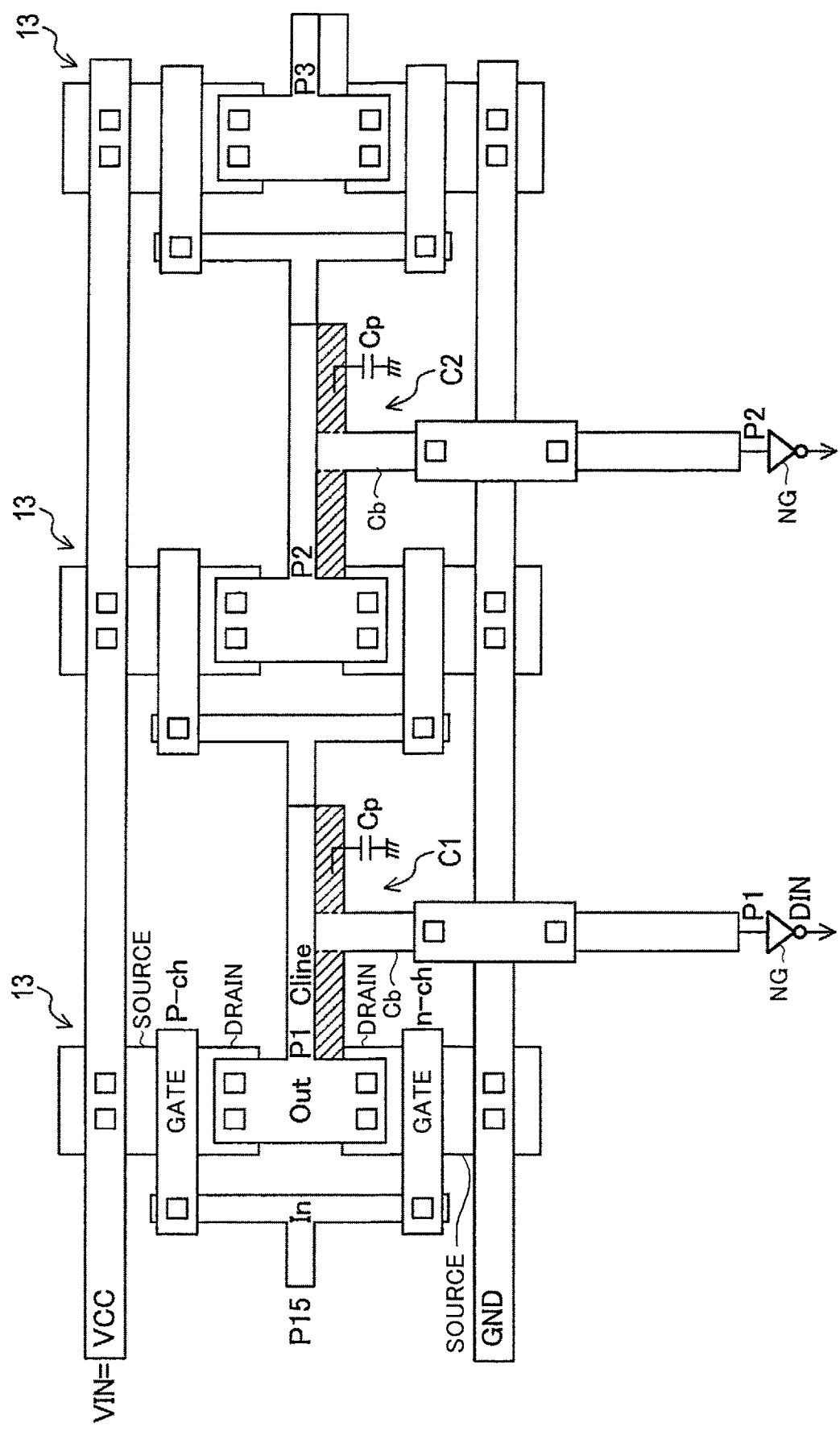
FIG. 4 is a layout diagram schematically illustrating a layout pattern of the first pulse delay circuit.

FIG. 4 schematically illustrates an exemplary configuration of each of the adjusters C1 and C2 as typical examples of the adjusters C1 to C15. Specifically, the configuration of each of the remaining adjusters C3 to C15 is identical to that of the adjuster C1, and therefore to that of the adjuster C2.

Note that, although the adjusters C1 to C15 are provided for the respective delay units 13 of the first pulse delay circuit 11, but the present disclosure is not limited thereto. Specifically, at least one adjuster can be provided for at least one selected delay unit 13 in the delay units 13.

In FIG. 4, reference character "In" represents the input terminal of the first delay unit 13, reference character "Out" represents the output terminal of the first delay unit 13, and reference character "DIN" represents the output P1 inputted to the encoder 16 through the NOT gate NG.

As illustrated in FIG. 4, the output P1 of the first delay unit 13 is outputted therefrom to the next delay unit 13 through a wiring line Cline connecting between the first delay unit 13 and the next delay unit 13, and also outputted to the encoder 16 through a branch line Cb. The wiring line Cline and branch line Cb are each made of, for example, aluminum.

Specifically, a part of the wiring line Cline of each of the delay units 13 has expanded in its width direction as compared with a normal wiring line, and the wiring line Cline of each of the delay units 13 has a capacitance component Cp. That is, adjustment of the amount of the expanded portion of the wiring line Cline, i.e., the length of the expanded portion of the wiring line Cline in its width direction, of each of the delay units 13 enables the capacitance component Cp to be adjusted. The expanded portion of the wiring line Cline of each of the delay units 13 (see hatched region in FIG. 4) therefore serves as the corresponding one of the adjusters C1 to C15.

Each adjuster C1 to C15 provided for the corresponding delay unit 13 functions as a measure for increasing a time constant t of the corresponding delay unit 13. This increase in the time constant t of each delay unit 13 enables the switching rate of the CMOS transistor of the corresponding delay unit 13 to become slower, resulting in the rate of transfer of the pulse signal passing through each delay unit 13 becoming slower. Note that the time constant t of each delay unit 13 can be calculated in accordance with (Cp•R) where R represents a resistance component of both the CMOS transistor and the corresponding wiring line Cline.

In contrast, no adjusters are provided for the respective delay units 13 of the second pulse delay circuit 21 according to the exemplary embodiment. That is, each delay unit 13 of the second pulse delay circuit 21 includes no hatched portion, which is illustrated in FIG. 4. This results in the length of each wiring line Cline in its width direction included in the second pulse delay circuit 21 being smaller than that of the corresponding wiring line Cline in its width direction included in the first pulse delay circuit 11.

FIG. 5C schematically illustrates how the output DTp of the encoder 16, which will also be referred to as the output ED1, of the first output unit 15 changes over time, and FIG. 5D schematically illustrates how the output DTp of the encoder 26, which will also be referred to as the output ED2, of the second output unit 25 changes over time. FIG. 5E schematically illustrates how the binary data value DTc1 finally outputted from the adder 18, i.e., the first digitizing unit 10, changes over time, and FIG. 5F schematically illustrates how the binary data value DTc2 finally outputted from the adder 28, i.e., the second digitizing unit 20, changes over time. FIG. 5G schematically illustrates how an average, i.e., one-half, of the digital data value DT, which is expressed by DT/2, changes over time.

Note that, as described above, because the first pulse delay circuit 11 is comprised of 15 ($2^{n=4}-1$) delay units 13, and the second pulse delay unit 21 is comprised of 17 ($2^{n=4}+1$) delay units 13, the output ED1 of the encoder 16 of the first output unit 15 is a binary 4-bit data value, and the output ED2 of the encoder 26 is a binary 5-bit data value.

Let us assume that the pulse signal has passed through five delay units in the delay units 13, and each of the output ED1 of the encoder 16 and the output ED2 of the encoder 26 is captured for every cycle of the reference clock CKs. This results in the output ED1 of the encoder 16 and the output ED2 of the encoder 26 increasing by 5 for every cycle of the reference clock CKs.

For example, 1 of the output ED1 of the encoder 16 becomes 6 after lapse of one cycle of the reference clock CKs, and 11 after lapse of cycle of The reference clock CKs. At that time, 11 of the output ED1 of the encoder 16 does not become 16 but becomes 17 after lapse of the cycle of the reference clock CKs, because an increase of 1 has occurred in the least significant bit of the output ED1 of the encoder 16 due to the overflow as an anomalous code increase.

In contrast, 3 of the output ET2 of the encoder 26 becomes 8 after lapse of one cycle of the reference clock CKs, and 13 after lapse of cycle of the reference clock CKs. At that time, 13 of the output ED2 of the encoder 26 does not become 18 but becomes 17 after lapse of the cycle of the reference clock CKs, because a decrease of 1 has occurred in the least significant bit of the output ED2 of the encoder 26 due to the overflow as an anomalous code decrease.

Figure 6A:
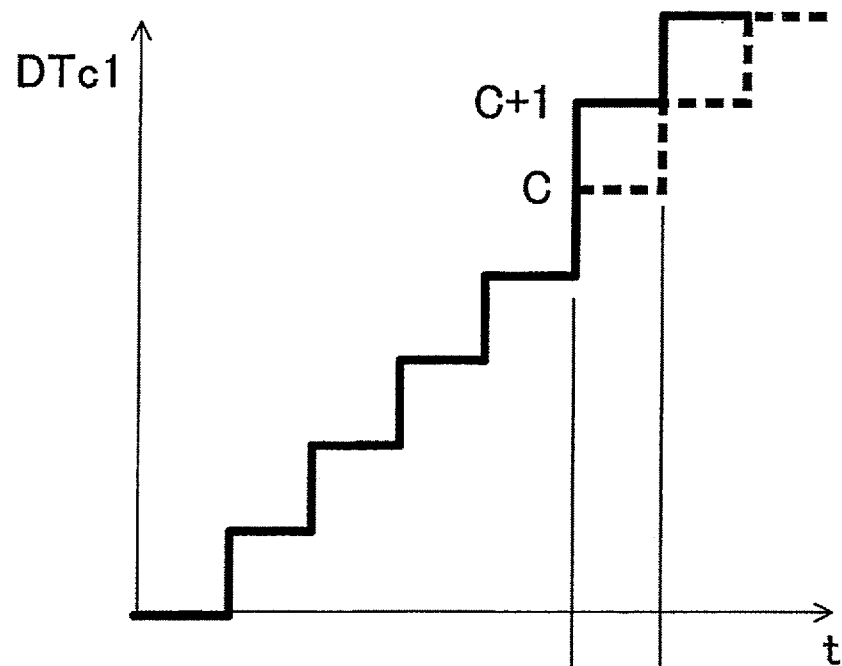
FIG. 6A is a graph schematically illustrating an increase of 1 of a least significant bit of a binary data value calculated by a first digitizing unit of the A/D converter.
Figure 6B:
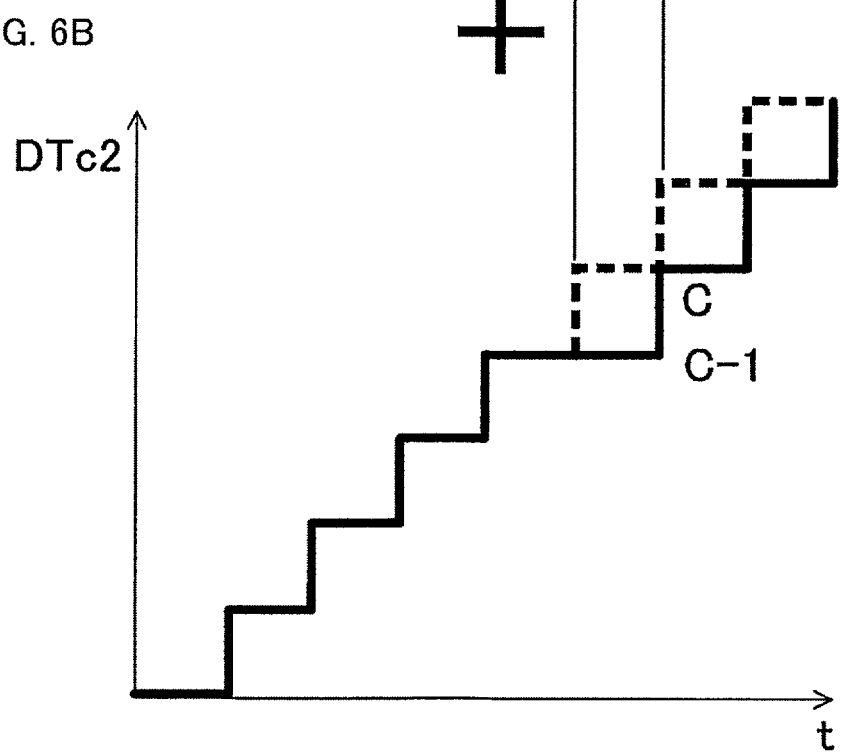
FIG. 6B is a graph schematically illustrating a decrease of 1 of a least significant bit of a binary data value calculated by a second digitizing unit of the A/D converter.

As described above, because the number X of the delay units 13 included in the pulse delay circuit 11 is 127, i.e., ($2^{n=7}-1$), the output (binary data value) DTc1 of the first digitizing unit 10 may become a value larger by 1 than a correct value C (see FIG. 6A). Similarly, because the number Y of the delay units 13 included in the pulse delay circuit 21 is 129, i.e., ($2^{n=7}+1$), the output (binary data value) DTc2 of the second digitizing unit 20 may become a value smaller by 1 than the correct value C (see FIG. 6B).

Figure 7:
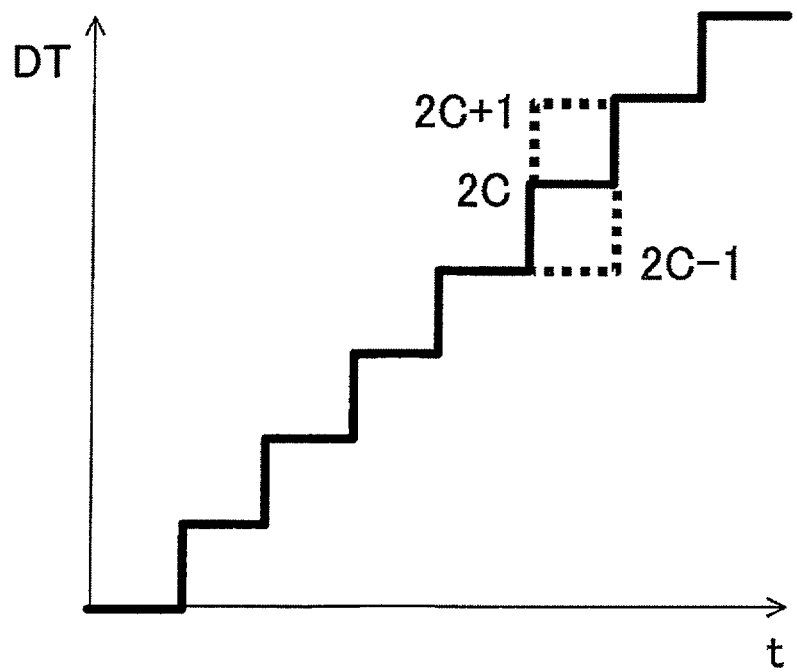
FIG. 7 is a graph schematically illustrating how the increase of 1 and the decrease of 1 cancel each other out.

From this viewpoint, the sum output unit 40 is configured to calculate the sum of the binary data value DTc1 and the binary data value DTc2, which can be represented by (DTc1+DTc2), to accordingly obtain a digital data value DT. Even if an increase of 1 of the least significant bit of the binary data value DTc1, which is expressed as (2C+1), and a decrease of 1 of the least significant bit of the binary data value DTc2, which is expressed as (2C−1), have occurred simultaneously, the above configuration of the sum output unit 40 results in, as illustrated in FIG. 7, the increase of 1 and the decrease of 1 cancelling each other out. This therefore makes it possible to supplement an increase of 1 of the least significant bit of a binary data value DTc1 as A/D conversion result of the first digitizing unit 10 with a decrease of 1 of the least significant bit of a binary data value DTc2 as A/D conversion result of the second digitizing unit 20, thus outputting a correct value 2C as the digital data value DT that is the result of analog-to-digital conversion of the analog signal VIN.

As described above, the A/D converter 1 is configured such that the difference between the first turnaround time and the second turnaround time becomes smaller to thereby reduce the difference between each occurrence of the anomalous code increase in the first digitizing unit 10 and the corresponding occurrence of the anomalous code decrease in the second digitizing unit 20 to accordingly reduce the difference between each occurrence of the overflow in the first pulse delay circuit 11 and the corresponding occurrence of the overflow in the second pulse delay circuit 21. This makes it possible to increase the probability of matching each occurrence of the overflow in the first digitizing unit 10 with the corresponding occurrence of the overflow in the second digitizing unit 20.

In particular, in order to achieve a more noticeable improvement of the increase in the probability, the A/D converter 1 according to the exemplary embodiment can be modified to employ the following configuration.

Figure 8A:
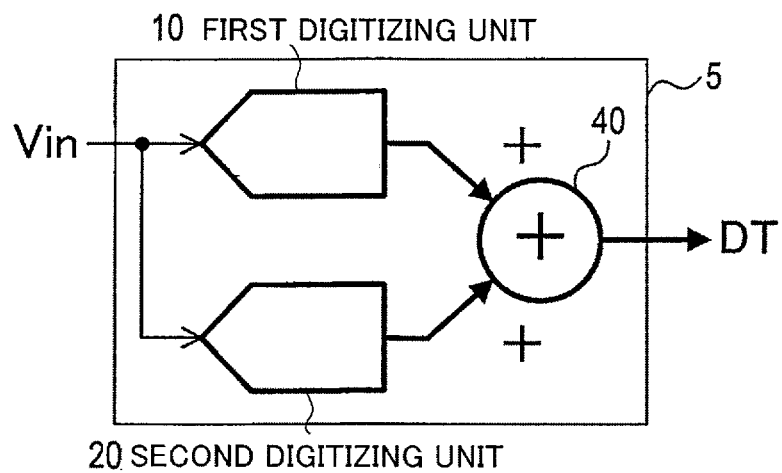
FIG. 8A is a block diagram of a basic unit.
Figure 8B:
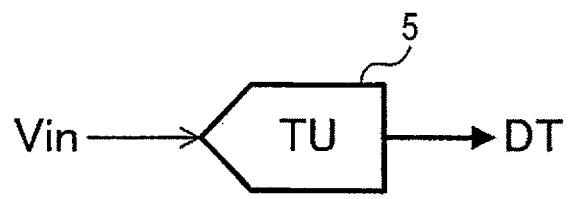
FIG. 8B is a block diagram schematically illustrating a reference character indicative of the basic unit.

In the modified A/D converter 1, a unit including the single first digitizing unit 10, the single second digitizing unit 20, and the single sum output unit 40 will be referred to as a single basic unit 5 (see FIG. 8A). The single basic unit 5 will be simply illustrated as TU 5 in each of FIGS. 8B and 8C.

Figure 8C:
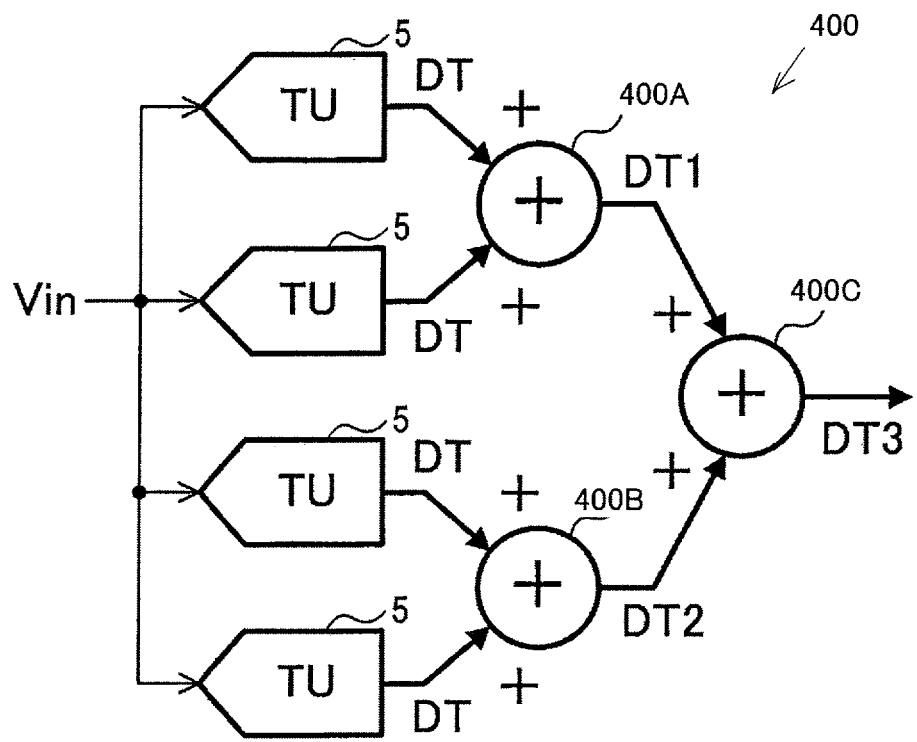
FIG. 8C is a modified A/D converter including four basic units 5, each of which is illustrated in FIGS. 8A and 8B.

That is, the modified A/D converter 1 for example includes four basic units 5, i.e., a first pair of basic units 5 and a second pair of basic units 5, as illustrated in FIG. 8C.

In addition, the modified A/D converter 1 includes a sum calculator 400 configured to calculate the sum of respective outputs, i.e., digital data values, DT of all the basic units 5 to thereby calculate a final digital data value DT3.

For example, the sum calculator 400 includes a first adder 400A configured to add the output DT of one of the first pair of the basic units 5 to the output DT of the other of the first pair of the basic units 5 to accordingly output a digital data value DT1. Similarly, the sum calculator 400 includes a second adder 400B configured to add the output DT of one of the second pair of the basic units 5 to the output DT of the other of the second pair of the basic units 5 to accordingly output a digital data value DT2.

The sum calculator 400 includes a third adder 400C configured to add the output DT1 of the first adder 400A to the output DT2 of the second adder 400B to accordingly output the final digital data value DT3.

That is, the final digital data value DT3 based on the sum of the respective outputs DT of all the basic units 5 is achieved as the output of the modified A/D converter 1. A value, which is obtained by dividing the final digital data value DT3 by the number of, i.e., 4, of the basic units 5, can be used as the output of the modified A/D converter 1.

The modified A/D converter 1 includes a plurality of basic units 5, resulting in an increase in the probability of matching, in at least one of the basic units 5, each occurrence of the overflow in the first digitizing unit 10 with the corresponding occurrence of the overflow in the second digitizing unit 20. This therefore makes it possible to increase the probability of matching, in at least one of the basic units 5, each occurrence of the anomalous code increase in the first digitizing unit 10 and the corresponding occurrence of the anomalous code decrease in the second digitizing unit 20, thus offering the modified A/D converter 1 with a higher A/D conversion accuracy. For example, if the number of the basic units 5 is set to N, the modified A/D converter 1 has an A/D conversion accuracy that is √T/times higher than an A/D converter with a single basic unit.

As described above, the A/D converter 1 according to the exemplary embodiment achieves the following advantageous benefits.

Specifically, the A/D converter 1 according to the exemplary embodiment is configured to digitize predetermined analog information.

The A/D converter 1 includes the first digitizing unit 10, the second digitizing unit 20, and the sum output unit 40.

The first digitizing unit 10 is comprised of the first pulse delay circuit 11 and the first output unit 15. The first pulse delay circuit 11 is comprised of the X delay units 13 connected in series to one another; the number X of delay units 13 serves as the number X of stages of delay The first output unit 15 is configured to output, as the binary data value DTc1, a data value based on the number of delay units 13 in the first pulse delay circuit 11 through which the pulse signal has passed.

The second digitizing unit 20 is comprised of the second pulse delay circuit 21 and the second output unit 25. The second pulse delay circuit 21 is comprised of the Y delay units 13 connected in series to one another; the number Y of delay units 13 serves as the number Y of stages of delay, and is larger than the number X of delay units 13 of the first pulse delay circuit 11.

The second output unit 25 is configured to output, as the binary data value DTc2, a data value based on the number of delay units 13 in the second pulse delay circuit 21 through which the pulse signal has passed.

Each delay unit 13 of each pulse delay circuit 11, 21 is configured such that the operating time of the corresponding delay unit depends on the voltage of the analog signal VIN, resulting in the delay time of each delay unit 13 depending on the voltage of the analog signal VIN.

The sum output unit 40 is configured to calculate the sum of the binary data value DTc1 outputted from the first output unit 15 and the binary data value DTc2 outputted from the second output unit 25 to accordingly obtain the calculated sum as the digital data value DT; the digital data value DT is the result of analog-to-digital conversion of the analog signal VIN.

In particular, the A/D converter 1 according to the exemplary embodiment is configured such that the first passage time for the first pulse delay circuit 11 and the second passage time for the second pulse delay circuit 21 are set to be different from one another; the difference between the first passage time and the second passage time enables the difference between the first turnaround time and the second turnaround time to be smaller as compared with the reference difference between the first turnaround time and the second turnaround time for the comparison example where the first passage time and the second passage time are identical to each other.

This configuration of the A/D converter 1 results in a reduction in the difference between the first turnaround time and the second turnaround time, making it possible to match the frequency of the occurrence of the overflow in the first pulse delay circuit 11 with that in the second pulse delay circuit 21 as uniform as possible. This therefore offers the A/D converter 1 with a higher A/D conversion accuracy.

The A/D converter 1 according to the exemplary embodiment can be configured such that one or more delay units 13 of the first digitizing unit 10 respectively include one or more adjusters C1 to C15 for increasing the first passage time for the first pulse delay circuit 11. The one or more adjusters C1 to C15 enable the first passage time for the first pulse delay circuit 11 to be adjusted.

The A/D converter 1 according to the exemplary embodiment can be configured such that all the delay units 13 of the first digitizing unit 10 respectively include the adjusters C1 to C15 for increasing the first passage time for the first pulse delay circuit 11. Each of the adjusters C1 to C15 can adjust time required for the pulse signal to pass through the corresponding one of the delay units 13 included in the first pulse delay circuit 11, making it possible to significantly adjust the first passage time for the first pulse delay circuit 11 while reducing non-uniformity among the outputs of the delay units 13 of the first pulse delay circuit 11.

Each of the delay units 13 of the first pulse delay circuit 11 can include a wiring line Cline that has a capacitance component Cp that serves as a corresponding one of the adjusters C1 to C15. This makes it possible for each delay unit 13 to have the corresponding adjuster with a simpler configuration.

Each adjuster C1 to C15 provided for the corresponding delay unit 13 functions as a measure for increasing the time constant t of the corresponding delay unit 13. This increase in the time constant t of each delay unit 13 enables the switching rate of the corresponding delay unit 13 to become slower, resulting in the rate of transfer of the pulse signal passing through each delay unit 13 becoming slower. Note that the time constant t of each delay unit 13 can be calculated in accordance with (Cp•R) where R represents the resistance component of both the corresponding delay unit 13 and the corresponding wiring line Cline.

Each delay unit 13 consists essentially of an inverter (INV) 13 as a switch thereof. Because each delay unit 13 includes no logical AND/OR gate, such as NAND gate, whose footprint is larger than that of an inverter, making it possible to make the geometry of the A/D converter 1 finer.

The A/D converter 1 can be modified to include a plurality of the basic units 5, each of the basic units 5 is comprised of the single first digitizing unit 10, the single second digitizing unit 20, and the single sum output unit 40.

This modified A/D converter 1 results in an increase in the probability of matching, in at least one of the basic units 5, each occurrence of the overflow in the first digitizing unit 10 with the corresponding occurrence of the overflow in the second digitizing unit 20. This therefore makes it possible to increase the probability of supplementing, in the at least one of the basic units 5, an increase of 1 of the least significant bit of an A/D conversion result of the first digitizing unit 10 with a decrease of 1 of the least significant bit of an A/D conversion result of the second digitizing unit 20. This therefore offers the modified A/D converter 1 with a higher A/D conversion accuracy.

Each delay unit 13 of each of the first and second pulse delay circuits 11 and 21 can be configured such that the analog signal VIN having a predetermined voltage is inputted thereto through the positive power supply line L1. Each of the first and second output units 15 and 25 is configured to digitize the number of delay units 13 in the corresponding one of the pulse delay circuits 11 and 21 through which the pulse signal has passed for a predetermined time, and output the corresponding one of the digitized numbers as the corresponding one of the binary data values DTc1 and DTc2.

These configurations therefore make it possible to output a digitized value based on the voltage of the analog signal as the binary data values DTc1 and DTc2.

The present disclosure is however not limited to the above exemplary embodiment, and can be variously modified or expanded as follows.

Each of the first and second pulse delay circuits 11 and 21 according to the exemplary embodiment is comprised of the delay units 13, each of which consists essentially of an inverter (INV) as a switch thereof, that is, each of which can be comprised of an inverter (INV) and one or more other devices that have little or no influence on the inverter. The present disclosure is however not limited thereto.

Figure 9:
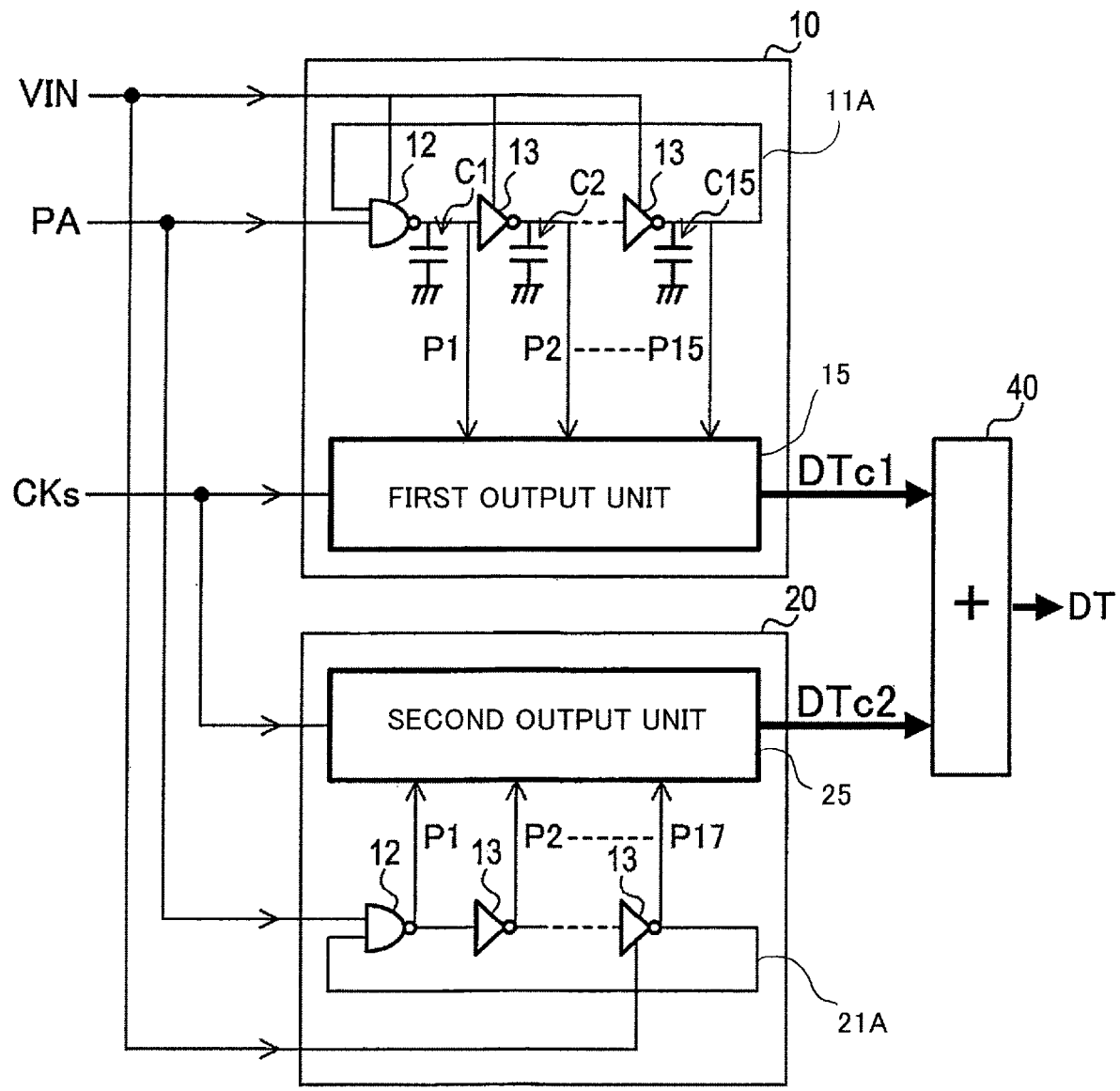
FIG. 9 is a circuit block diagram schematically illustrating a first pulse delay circuit and a second pulse delay circuit according to the first modification of the exemplary embodiment.

Specifically, as illustrated in FIG. 9, each of a first pulse delay circuit 11A and a second pulse delay circuit 21A according to the first modification of the exemplary embodiment can be comprised of a first delay unit 12 and the delay units 13; the first delay unit 12 is comprised of a logical AND/OR gate, such as a NAND gate in FIG. 9, as a switch thereof. That is, each delay unit of each of the first pulse delay circuit 11A and second pulse delay circuit 21A can include at least one of one or more logical AND/OR gates and one or more inverters.

This configuration of the first modification enables a pulse signal PA to be inputted to the first delay unit, i.e., the NAND gate, 12, of each of the first and second pulse delay circuits 11A and 21A.

A/D converters, which are applied to faster communication devices, are required to have finer geometries. For addressing such a requirement, each of the first and second pulse delay circuits 11 and 21 of the A/D converter 1 can be preferably comprised of the delay units 13, such as inverters, without including any logical AND/OR gates. This is because logical AND/OR gates have a lower operating speed than that of inverters, and each have a larger layout-space, i.e., a footprint, than that of an inverter.

In contrast, A/D converters, which are applied to low-frequency devices, such as physical sensors, are less likely to be required to be faster. For this reason, if the A/D converter 1 is applied to such a low-frequency device, each of the first and second pulse delay circuits 11 and 21 of the A/D converter 1 can be comprised of the delay units 12, 13, such as one or more inverters and one or more logical AND/OR gates, with no problem.

The capacitance component Cp of the wiring line Cline of each of the delay units 13 of the first pulse delay circuit 11 constitutes a corresponding one of the adjusters C1 to C15, but the present disclosure is not limited thereto.

Figure 10:
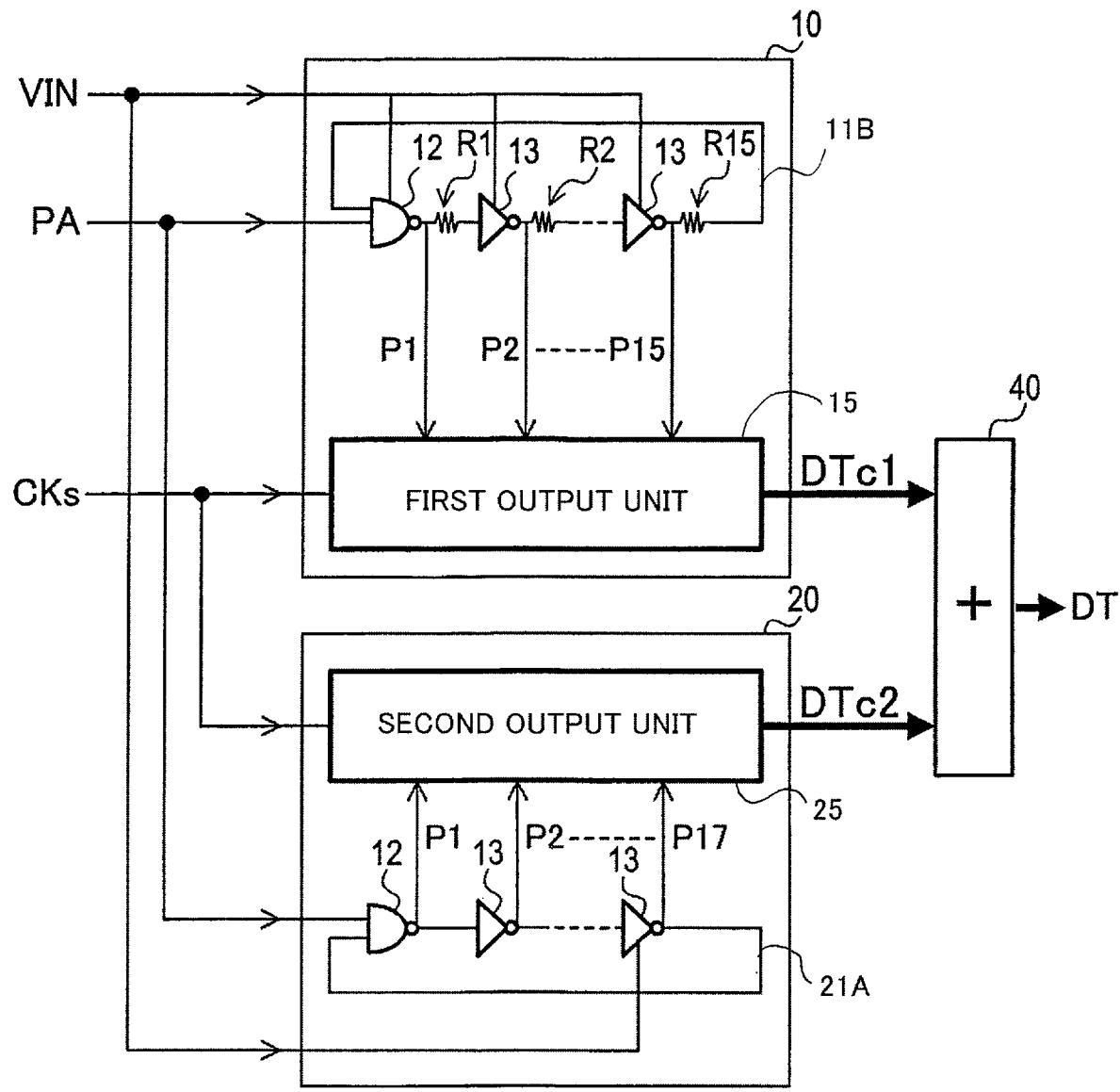
FIG. 10 is a circuit block diagram schematically illustrating a first pulse delay circuit according to the second modification of the exemplary embodiment.

Specifically, as a first example illustrated in FIG. 10, a resistance component R1 to R15 of the wiring line Cline of each of the delay units 13 of a first pulse delay circuit 11B can constitute a corresponding one of the adjusters C1 to C15.

This modification enables the time constant t of each delay unit 12, 13 to be efficiently greater.

Figure 11:
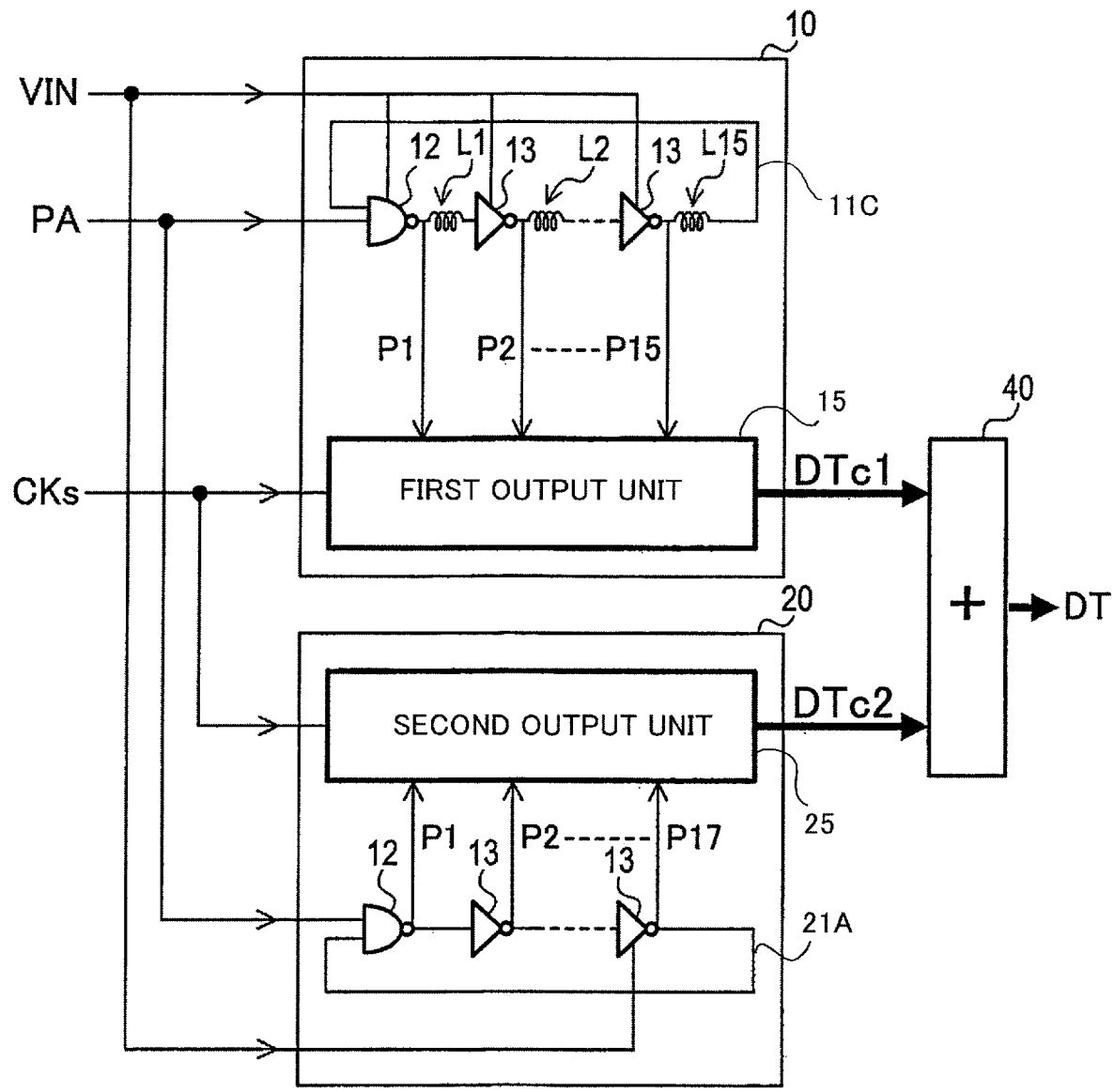
FIG. 11 is a circuit block diagram schematically illustrating a first pulse delay circuit according to the third modification of the exemplary embodiment.

As a second example illustrated in FIG. 11, an inductance component L1 to L15 of the wiring line Cline of each of the delay units 13 of a first pulse delay circuit 11C can constitute a corresponding one of the adjusters C1 to C15.

This modification results in each wiring line Cline of each delay unit 12, 13 connected to the next delay unit 13 reducing a voltage change therethrough, making it possible to adjust the first passage time for the first pulse delay circuit 11B to be greater.

The first pulse delay circuit 11 is comprised of X delay units 13, the number X being set to $2^n-1$, and the second pulse delay circuit 21 is comprised of Y delay units 13, the number Y being set to $2^n+1$. The present disclosure is however not limited thereto.

Specifically, the number of delay units 13 in the first pulse delay circuit 11 and the number of delay units 13 in the second pulse delay circuit 21 can be set to any value as long as the number Y is more than the number X.

For example, the first pulse delay circuit 11 can be comprised of X1 delay units 13, the number X1 being set to $2^n-(2m-1)$, and the ring-like pulse delay circuit 21 is comprised of Y1 delay units 13, the number Y1 being set to $2^n+(2m-1)$; m is a natural number, and n is more than or equal to m.

This modified A/D converter 1 results in the number of delay units 13 included in each of the first and second delay units 11 and 21 being an odd number. This configuration of the modified A/D converter 1 therefore makes it possible to invert the logical level of the pulse signal each time the pulse signal, which has passed through all the delay units 13, returns to be inputted to the first delay unit 13.

Each of the pulse delay circuits 11 and 21 is comprised of a plurality of delay units 13 connected in series to one another in a ring form, but the present disclosure is not limited thereto.

Specifically, each of the pulse delay circuits 11 and 21 can be comprised of a plurality of delay units 13 connected in series to one another in line, and can be configured such that, in response to the pulse signal passing through the last delay unit 13, another pulse signal is inputted to the first delay unit 13.

The exemplary embodiment shows an example where the first and second pulse delay circuits 11 and 21 are applied to the A/D converter 1, but the present disclosure is not limited thereto.

Specifically, the first and second pulse delay circuits 11 and 21 can be applied to an A/D converter circuit for digitizing predetermined analog information, such as time, temperature, stress, or another physical analog information.

For example, the A/D converter 1 can be configured such that
(1) The voltage of the analog signal VIN is constant
(2) The bias voltage VBB is constant
(3) The ground voltage GND is constant
(4) The reference clock CKs is inputted to the A/D converter 1 at a measurement start time and thereafter also inputted thereto at a measurement end time This enables the A/D converter 1 to serve as a time-based A/D converter circuit for digitizing a difference between the time between the measurement end time and the measurement start time.

As another example, the A/D converter 1 can be configured such that
(1) The voltage of the analog signal VIN is constant
(2) The bias voltage VBB is constant
(3) The ground voltage GND is constant
(4) The period Ts of the reference clock CKs is constant
(5) Obtained values of the digital data value DT for respective periods Ts of the reference clock CKs are respectively stored to correlate with corresponding current values of ambient temperature around the A/D converter 1 or corresponding respective values of stress applied to the A/D converter 1

This makes it possible to measure a current value of the ambient temperature based on an actually obtained value of the digital data value DT outputted from the A/D converter 1 serving as a temperature digitizing apparatus, and measure a current value of the stress applied to the A/D converter 1 serving as a stress digitizing apparatus based on an actually obtained value of the digital data value DT outputted from the A/D converter 1.

The functions of one element in the exemplary embodiment and its modifications can be distributed as plural elements, and one function of one element can be implemented by plural elements. The functions that plural elements have can be implemented by one element, and one function implemented by plural elements can be implemented by one element. At least part of the structure of each of the exemplary embodiment and its modifications can be eliminated. At least part of one of the exemplary embodiment and its modifications can be added to the structure of another of the exemplary embodiment and its modifications, or can be replaced with a corresponding part of another of the exemplary embodiment and its modifications.

The present disclosure can be implemented by various embodiments in addition to the A/D converter 1; the various embodiments include (i) A/D converter circuits each including the pulse delay circuits 11 and 21, (ii) systems each include such an A/D converter circuit, and (iii) methods for digitizing predetermined analog information.

While illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. An analog-to-digital converter circuit for digitizing predetermined analog information, the analog-to-digital converter circuit comprising:
   a first digitizing unit that comprises:
      a first pulse delay circuit comprising a plurality of first delay units connected in series, each first delay unit being configured such that an analog signal having a voltage is inputted thereto, the first pulse delay circuit being configured to transfer a first pulse signal therethrough while the first pulse signal is delayed by each first delay unit, a delay time of each first delay unit depending on the voltage of the analog signal; and
      a first output unit configured to output a first digital data value based on the number of first delay units in the first pulse delay circuit through which the pulse signal has passed;
   a second digitizing unit that comprises:
      a second pulse delay circuit comprising a plurality of second delay units connected in series, each second delay unit being configured such that the analog signal is inputted thereto, the second pulse delay circuit being configured to transfer a second pulse signal therethrough while the second pulse signal is delayed by each second delay unit, a delay time of each second delay unit depending on the voltage of the analog signal, the plurality of second delay units being greater than the plurality of first delay units; and
      a second output unit configured to output a second digital data value based on the number of second delay units in the second pulse delay circuit through which the pulse signal has passed; and
   a sum output unit configured to calculate the sum of the first digital data value outputted from the first output unit and the second digital data value outputted from the second output unit to accordingly obtain the calculated sum as a final digital data value, wherein:
      time required for the first pulse signal to have passed through all the delay units included in the first pulse delay circuit is defined as first turnaround time;
      time required for the second pulse signal to have passed through all the delay units included in the second pulse delay circuit is defined as second turnaround time;
      average time required for the first pulse signal to pass through any of the delay units included in the first pulse delay circuit is defined as first passage time;
      average time required for the second pulse signal to pass through any of the delay units included in the second pulse delay circuit is defined as second passage time; and the first passage time for the first pulse delay circuit and the second passage time for the second pulse delay circuit are set to be different from one another, a difference between the first passage time and the second passage time enabling a difference between the first turnaround time and the second turnaround time to be smaller as compared with a reference difference between the first turnaround time and the second turnaround time for a case where the first passage time and the second passage time are identical to each other.

2. The analog-to-digital converter circuit according to claim 1, wherein:
at least one of the delay units of the first pulse delay circuit includes an adjuster for increasing the first passage time.

3. The analog-to-digital converter circuit according to claim 2, wherein:
the at least one of the delay units has a wiring line; and
the wiring line of the at least one of the delay units has a capacitance component that serves as the adjuster.

4. The analog-to-digital converter circuit according to claim 3, wherein:
each delay unit of each of the first and second pulse delay circuits consists essentially of an inverter.

5. The analog-to-digital converter circuit according to claim 2, wherein:
the at least one of the delay units has a wiring line; and
the wiring line of the at least one of the delay units has a resistance component and an inductance component, the resistance component or the inductance component of the at least one of the delay units serving as the adjuster.

6. The analog-to-digital converter circuit according to claim 5, wherein:
each delay unit of each of the first and second pulse delay circuits consists essentially of an inverter.

7. The analog-to-digital converter circuit according to claim 2, wherein:
the at least one of the delay units has a wiring line; and
the wiring line of the at least one of the delay units has at least one of a capacitance component, a resistance component, and an inductance component, the at least one of the capacitance component, the resistance component, and the inductance component of the at least one of the delay units serving as the adjuster.

8. The analog-to-digital converter circuit according to claim 7, wherein:
each delay unit of each of the first and second pulse delay circuits consists essentially of an inverter.

9. The analog-to-digital converter circuit according to claim 2, wherein:
each delay unit of each of the first and second pulse delay circuits consists essentially of an inverter.

10. The analog-to-digital converter circuit according to claim 1, wherein:
each of the delay units of the first pulse delay circuit includes an adjuster for increasing the first passage time.

11. The analog-to-digital converter circuit according to claim 10, wherein:
each delay unit of each of the first and second pulse delay circuits consists essentially of an inverter.

12. The analog-to-digital converter circuit according to claim 1, wherein:
each delay unit of each of the first and second pulse delay circuits is comprised of at least one of a logical AND/OR gate and an inverter.

13. The analog-to-digital converter circuit according to claim 1, wherein:
each delay unit of each of the first and second pulse delay circuits consists essentially of an inverter.

14. The analog-to-digital converter circuit according to claim 1, wherein:
the first digitizing unit comprises a predetermined number of first digitizing units;
the second digitizing unit comprises the same number of second digitizing units; and
the sum output unit comprises the same number of sum output units; and
the first digitizing units, the second digitizing units, and the sum output units constitute a plurality of basic units, each of the basic units comprising a corresponding one of the first digitizing units, a corresponding one of the second digitizing units, and a corresponding one of the sum output units.

* * * * *